(12) United States Patent
Ninomiya et al.

(10) Patent No.: US 9,379,030 B2
(45) Date of Patent: Jun. 28, 2016

(54) ION IMPLANTATION METHOD AND ION IMPLANTATION APPARATUS

(71) Applicant: Sumitomo Heavy Industries Ion Technology Co., Ltd., Tokyo (JP)

(72) Inventors: Shiro Ninomiya, Ehime (JP); Tadanobu Kagawa, Ehime (JP); Toshio Yumiyama, Ehime (JP); Akira Funai, Ehime (JP); Takashi Kuroda, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 176 days.

(21) Appl. No.: 14/013,862

(22) Filed: Aug. 29, 2013

(65) Prior Publication Data

US 2014/0065737 A1 Mar. 6, 2014

(30) Foreign Application Priority Data

Aug. 31, 2012 (JP) ................................. 2012-192420

(51) Int. Cl.
*H01L 21/66* (2006.01)
*H01J 37/08* (2006.01)
*C23C 14/48* (2006.01)
*H01J 37/304* (2006.01)
*H01J 37/317* (2006.01)

(52) U.S. Cl.
CPC ................ *H01L 22/14* (2013.01); *C23C 14/48* (2013.01); *H01J 37/304* (2013.01); *H01J 37/3171* (2013.01); *H01J 2237/0206* (2013.01)

(58) Field of Classification Search
CPC .... H01L 21/14; H01J 37/304; H01J 37/3171; C23C 14/48
USPC ................ 438/10, 14, 17, 18, 514, 516, 518; 250/492.21, 492.3
See application file for complete search history.

(56) References Cited

U.S. PATENT DOCUMENTS

| | | | |
|---|---|---|---|
| 6,720,563 B1 * | 4/2004 | Kabasawa | H01J 37/304 250/492.1 |
| 2003/0160190 A1 * | 8/2003 | Kawaguchi | H01J 37/3171 250/492.21 |
| 2008/0251713 A1 * | 10/2008 | Tsukihara | H01J 37/045 250/282 |

FOREIGN PATENT DOCUMENTS

| | | |
|---|---|---|
| JP | 05-074400 A | 3/1993 |
| JP | 08-064166 A | 3/1996 |
| JP | H09-82266 A | 3/1997 |
| JP | 2008-530785 A | 8/2008 |
| JP | 2008-262748 A | 10/2008 |
| JP | 2008-262756 | 10/2008 |
| WO | WO-2006/084143 A2 | 8/2008 |

* cited by examiner

*Primary Examiner* — Kevin M Picardat
(74) *Attorney, Agent, or Firm* — Michael Best and Friedrich

(57) ABSTRACT

Provided is an ion implantation method of transporting ions generated by an ion source to a wafer and implanting the ions into the wafer by irradiating an ion beam on the wafer, including, during the ion implantation into the wafer, using a plurality of detection units which can detect an event having a possibility of discharge and determining a state of the ion beam based on existence of detected event having a possibility of discharge and a degree of influence of the event on the ion beam.

20 Claims, 10 Drawing Sheets

| | DOSE AMOUNT | IMPLANTATION ANGLE | HORIZONTAL BEAM WIDTH | VERTICAL BEAM WIDTH |
|---|---|---|---|---|
| ION SOURCE | ○ | | ○ | ○ |
| EXTRACTION ELECTRODE | ○ | | ○ | ○ |
| BEAM SCANNER | ○ | ○ | | |
| PARALLEL LENS | ○ | ○ | | |
| ANGULAR ENERGY FILTER | | ○ | | |
| ELECTROSTATIC LENS | | | ○ | ○ |
| ELECTROSTATIC BEAM STEERING | ○ | | | |

FIG.4

| | DOSE AMOUNT | IMPLANTATION ANGLE | HORIZONTAL BEAM WIDTH | VERTICAL BEAM WIDTH |
|---|---|---|---|---|
| ION SOURCE | ○ | | ○ | ○ |
| EXTRACTION ELECTRODE | ○ | | ○ | ○ |
| BEAM SCANNER | ○ | ○ | | |
| PARALLEL LENS | | ○ | | |
| ANGULAR ENERGY FILTER | | ○ | | |
| ELECTROSTATIC LENS | | | ○ | |
| ELECTROSTATIC BEAM STEERING | | | | |

FIG.5

|  | SITUA-TION #1 | SITUA-TION #2 | SITUA-TION #3 | SITUA-TION #4 | SITUA-TION #5 | SITUA-TION #6 | SITUA-TION #7 |
|---|---|---|---|---|---|---|---|
| DOSE CUP MEASUREMENT | ○ |  |  | ○ | ○ |  | ○ |
| POWER SUPPLY AFFECTING DOSE AMOUNT |  | ○ |  | ○ |  | ○ | ○ |
| POWER SUPPLY AFFECTING HORIZONTAL BEAM WIDTH |  |  | ○ |  | ○ | ○ | ○ |
| BEAM STATE DETERMINATION (FIRST EMBODIMENT) | NG | NG | NG | NG | NG | NG | NG |

FIG.6

|  | SITUA-TION #1 | SITUA-TION #2 | SITUA-TION #3 | SITUA-TION #4 | SITUA-TION #5 | SITUA-TION #6 | SITUA-TION #7 |
|---|---|---|---|---|---|---|---|
| DOSE CUP MEASUREMENT | ○ |  |  | ○ | ○ |  | ○ |
| POWER SUPPLY AFFECTING DOSE AMOUNT |  | ○ |  | ○ |  | ○ | ○ |
| POWER SUPPLY AFFECTING HORIZONTAL BEAM WIDTH |  |  | ○ |  | ○ | ○ | ○ |
| BEAM STATE DETERMINATION (SECOND EMBODIMENT) | OK | OK | OK | NG | OK | OK | NG |

FIG.7

|  | SITUA-TION #1 | SITUA-TION #2 | SITUA-TION #3 | SITUA-TION #4 | SITUA-TION #5 | SITUA-TION #6 | SITUA-TION #7 |
|---|---|---|---|---|---|---|---|
| DOSE CUP MEASUREMENT | ○ |  |  | ○ | ○ |  | ○ |
| POWER SUPPLY AFFECTING DOSE AMOUNT |  | ○ |  | ○ |  | ○ | ○ |
| POWER SUPPLY AFFECTING HORIZONTAL BEAM WIDTH |  |  | ○ |  | ○ | ○ | ○ |
| BEAM STATE DETERMINATION (THIRD EMBODIMENT) | OK | NG | NG | NG | NG | NG | NG |

FIG.8

|  | SITUA-TION #1 | SITUA-TION #2 | SITUA-TION #3 | SITUA-TION #4 | SITUA-TION #5 | SITUA-TION #6 | SITUA-TION #7 |
|---|---|---|---|---|---|---|---|
| DOSE CUP MEASUREMENT | ○ |  |  | ○ | ○ |  | ○ |
| POWER SUPPLY AFFECTING DOSE AMOUNT |  | ○ |  | ○ |  | ○ | ○ |
| POWER SUPPLY AFFECTING HORIZONTAL BEAM WIDTH |  |  | ○ |  | ○ | ○ | ○ |
| BEAM STATE DETERMINATION (FOURTH EMBODIMENT) | OK | NG | OK | NG | OK | NG | NG |

FIG.9

|  | SITUA-TION #1 | SITUA-TION #2 | SITUA-TION #3 | SITUA-TION #4 | SITUA-TION #5 | SITUA-TION #6 | SITUA-TION #7 |
|---|---|---|---|---|---|---|---|
| DOSE CUP MEASUREMENT | ○ |  |  | ○ | ○ |  | ○ |
| POWER SUPPLY AFFECTING DOSE AMOUNT |  | ○ |  | ○ |  | ○ | ○ |
| POWER SUPPLY AFFECTING HORIZONTAL BEAM WIDTH |  |  | ○ |  | ○ | ○ | ○ |
| BEAM STATE DETERMINATION (FOURTH EMBODIMENT) | OK | OK | NG | OK | NG | NG | NG |

FIG.10

|  | SITUATION #1 | SITUATION #2 | SITUATION #3 |
|---|---|---|---|
| DOSE CUP MEASUREMENT | − | − | − |
| POWER SUPPLY AFFECTING DOSE AMOUNT | ○ |  | ○ |
| POWER SUPPLY AFFECTING HORIZONTAL BEAM WIDTH |  | ○ | ○ |
| BEAM STATE DETERMINATION (FIFTH EMBODIMENT) | OK | NG | NG |

ION IMPLANTATION METHOD AND ION IMPLANTATION APPARATUS

BACKGROUND OF THE INVENTION

1. Field of the Invention

The present invention relates to ion implantation, and more particularly, to an ion implantation method and an ion implantation apparatus (ion implanter).

2. Description of the Related Art

In semiconductor manufacturing processes, a process for implanting ions into a semiconductor wafer (hereinafter, referred to as an "ion implantation process") is performed in a standard procedure for the purpose of changing conductivity, changing a crystalline structure of the semiconductor wafer, or the like. An apparatus used in the ion implantation process is generally called an ion implanter and has a function of generating an ion beam which is ionized by an ion source and then accelerated, and a function of transporting the ion beam to the semiconductor wafer and irradiating the above-described wafer with the ion beam.

The ion implanter is configured so that, for example, an ion source, an extraction electrode, a mass analysis magnet device, amass analysis slit, an acceleration/deceleration device, a wafer processing chamber, and the like are arranged along a beamline so as to implant ions into a wafer which is a semiconductor substrate.

In general, it is preferable that the state of an ion beam which is to be irradiated on a wafer be stable. However, in some cases, the state of the ion beam is changed due to various factors. Therefore, if components of the ion implanter are not controlled as needed after detecting the change of the ion beam by some means, it is difficult to securely manufacture a semiconductor having desired performance. Accordingly, an ion implanter having a Faraday cup for measuring a beam current of an ion beam at a desired timing is contrived.

Sometimes, in an ion implanter, a discharge event which can affect the ion beam may occur. The discharge event influences ion implantation by the ion beam and is one of factors causing a difference in performance of finally manufactured semiconductor products. Therefore, it is important to detect the discharge event in an ion implantation process. However, it is difficult to accurately detect the discharge event through the measurement of the beam current of the ion beam using only the above-described Faraday cup.

SUMMARY OF THE INVENTION

The present invention has been achieved in consideration of such circumstances and an object of the invention is to provide a technique for appropriately detecting a discharge event in an ion implantation process.

In order to solve the problem, according to one aspect of the invention, an ion implantation method of transporting ions generated by an ion source to a wafer and implanting the ions into the wafer by irradiating an ion beam on the wafer, includes, during the ion implantation into the wafer, using a plurality of detection units which can detect an event having a possibility of discharge and determining a state of the ion beam based on existence of detected event having a possibility of discharge.

According to another aspect of the present invention, there is provided an ion implantation apparatus (ion implanter). The apparatus includes: a component constituting a beamline which transports ions generated by an ion source to a wafer; a plurality of detection units which can detect an event having a possibility of discharge during ion implantation into the wafer by irradiating an ion beam on the wafer; and a determination unit which determines a state of the ion beam based on existence of the event having a possibility of discharge detected by the plurality of detection.

In addition, an arbitrary combination of the components mentioned hereinbefore or a replacement of the components or expression of the present invention among a method, an apparatus, a system, and the like is also valid as an aspect of the present invention.

BRIEF DESCRIPTION OF THE DRAWINGS

FIG. 3 is a diagram illustrating an example of power supply classification of a hybrid scanning ion implanter;

FIG. 4 is a diagram illustrating another example of power supply classification of the hybrid scanning ion implanter;

FIG. 5 is a diagram illustrating a relation between detection of discharge event and discharge determination according to the first embodiment;

FIG. 6 is a diagram illustrating a relation between detection of discharge event and discharge determination according to a second embodiment;

FIG. 7 is a diagram illustrating a relation between detection of discharge event and discharge determination according to a third embodiment;

FIG. 8 is a diagram illustrating a relation between detection of discharge event and discharge determination according to a fourth embodiment;

FIG. 9 is a diagram illustrating a relation between detection of discharge event and discharge determination according to the fourth embodiment; and FIG. 10 is a diagram illustrating a relation between detection of discharge event and discharge determination according to a fifth embodiment.

DETAILED DESCRIPTION OF THE INVENTION

Figure 1A:
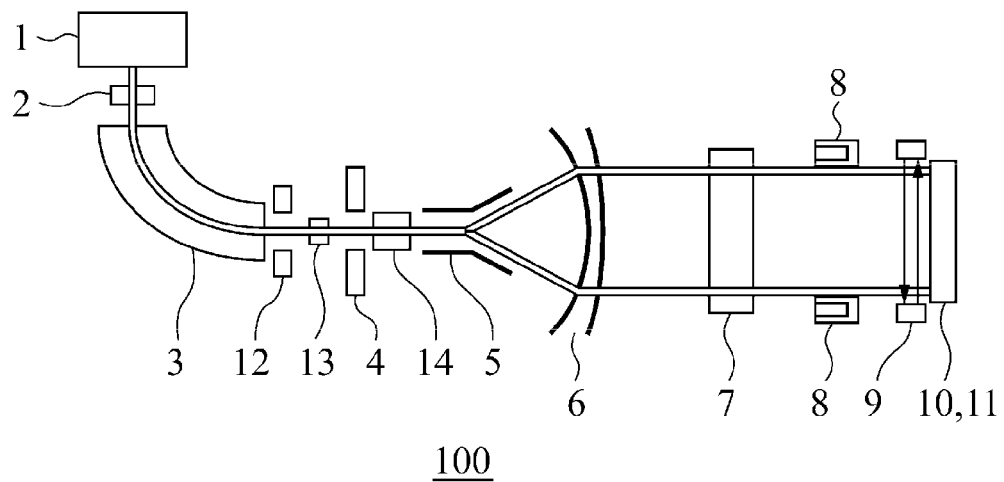
FIG. 1A is a schematic plane view illustrating a configuration of a hybrid scanning ion implanter according to a first embodiment.

The invention will now be described by reference to the preferred embodiments. This does not intend to limit the scope of the present invention, but to exemplify the invention.

Details of how the present invention was achieved will be described first. Various types of ion implantation processes are employed in a semiconductor manufacturing process. In a typical ion implantation process, ions are incident on the entire surface of a semiconductor wafer while maintaining uniformity of physical quantities characterizing the ion implantation process.

Herein, as representative physical quantities characterizing the ion implantation process, there are an ion implantation dose, an ion implantation angle, an ion energy, an ion type, and the like. In addition, recently, according to miniaturization of manufactured semiconductor products, an amount of damage during ion implantation is also considered to be one of the representative physical quantities characterizing the ion implantation process.

It is known that the amount of damage during the ion implantation is changed according to a temperature of a semiconductor wafer, a beam size of an ion beam on the semiconductor wafer, the below-described temporal pattern of the ion implantation into the semiconductor wafer, and the like.

Therefore, it may be considered that these physical quantities are also the representative physical quantities characterizing the ion implantation process.

Recently, in the ion implantation process, it is required to change the above-described physical quantities for each ion implantation process. However, it is not required to maintain complete uniformity of all the above-described physical quantities over the surface of the semiconductor wafer, and it is also practically difficult. Therefore, it is preferable that the uniformity of the above-described physical quantities over the surface falls within a range below a threshold value. However, the threshold value is different among various types of ion implantation processes.

For example, it is known that, in anion implantation process called a gate implantation process, in many cases, although a difference in the ion implantation dose over the surface of the wafer is about 10%, there may be no difference in performance of finally manufactured semiconductor products. On the other hand, in an ion implantation process called an extension implantation process, in many cases, although the difference in the ion implantation dose over the surface of the wafer is 1%, there is a difference in performance of finally manufactured semiconductor products. Such a threshold value is different according to the ion implantation processes, the physical quantities characterizing the ion implantation process, and the design of the semiconductor. Therefore, it is difficult to generalize the above description. However, it should be noted that allowable ranges of the representative physical quantities characterizing the ion implantation process required for an ion implantation process are not uniquely determined.

In addition, in a semiconductor manufacturing process, the productivity is important, and the importance of the productivity is also required for each of the ion implantation processes as portions of the semiconductor manufacturing process. The productivity denotes how many semiconductor products of which performance falls within an allowable range of the semiconductor product among the finally manufactured semiconductor products can be manufactured within a unit time. If the point and the requirement of the above-described uniformity over the surface are considered, the requirements for the ion implanters in the individual ion implantation processes can be easily understood.

Namely, in the case where a large difference in performance of finally manufactured semiconductor products occurs due to a small difference in physical quantities characterizing the ion implantation process, sufficient preparation before the ion implantation is needed so as for the difference in the physical quantities over the entire surface of the semiconductor wafer during the ion implantation not to occur. Sufficient countermeasures to the change in the physical quantity temporarily or continuously occurring during the ion implantation are needed.

On the other hand, although the difference in physical quantities characterizing the ion implantation process is large to some extent, in the case where there is no difference in performance of finally manufactured semiconductor products, the occurrence of the difference in the physical quantities on the entire surface of the semiconductor wafer during the ion implantation may be accepted to some extent, so that the preparation before the ion implantation can be simplified. With respect to the change in the physical quantity temporarily or continuously occurring during the ion implantation, only in the case where the amount of change in the physical quantity is too large and the difference in performance of finally manufactured semiconductor products occurs, the countermeasures to the change in the physical quantities may be implemented.

In the latter case, if unnecessary countermeasures to the change in the physical quantity are made, time is wasted in implementing countermeasures in the ion implantation process, and as a result, the productivity of the semiconductor manufacturing process is deteriorated. Therefore, as performance required for the ion implanter, there may be performance of being capable of appropriately changing a range of change in each physical quantity characterizing the ion implantation process, which is required for each ion implantation process, before the ion implantation according to each of ion implantation processes.

The ion implanter (ion implantation apparatus) according to each of the below-described embodiments is one of the ion implanters which are mainly used particularly for a semiconductor manufacturing process. More specifically, the ion implanter according to each of the below-described embodiments is an ion implanter (hereinafter, referred to as a "hybrid scanning ion implanter") employing an ion implantation method of transporting ions generated by an ion source to a wafer (hereinafter, the transport route is referred to as a "beamline") and implanting the ions into the wafer by the ion beam reciprocally scanning in one direction and mechanically scanning the wafer in the direction perpendicular to the beam scanning direction. The ion implantation method performed by the above-described apparatus is sometimes referred to as a hybrid scanning ion implantation method.

Herein, how the above-described representative physical quantities characterizing the ion implantation process are controlled in the hybrid scanning ion implanter will be described as an example.

First, the ion type is controlled by changing the ions generated by the ion source. The ion energy is controlled by changing the voltage applied to the ion source. The ion implantation angle is controlled by changing the angle of the semiconductor wafer with respect to the ion beam. Although there are various methods of controlling the ion implantation dose, as an example, the ion implantation dose may be controlled by measuring a beam current amount at a position of the semiconductor wafer before the ion implantation and controlling a speed of mechanically scanning the wafer based on the measured value of the beam current amount. The ion implantation dose, the ion implantation angle, the ion energy, and the ion type are representative physical quantities characterizing the ion implantation process and are ion implantation conditions set by the ion implanter before the ion implantation.

As a method of controlling the amount of damage during the ion implantation, there are a method of controlling the temperature of the semiconductor wafer, a method of controlling the beam size on the semiconductor wafer due to a change in parameters of the apparatus transporting the ions to the wafer, and the like. In addition to the above-described methods, a method of changing a temporal pattern of the ion implantation by changing the ion beam scan frequency and, as a result, controlling the amount of damage during the ion implantation may be considered.

Particularly, with respect to the effect of the ion beam scan frequency, in the case where the ion beam scan frequency is high, the ions are almost continuously implanted into a point on the semiconductor wafer. However, the temperature at the point during the ion implantation is continuously increased due to the effect of an increase in temperature by the ion implantation. In the case where the ion beam scan frequency is low, the ions are intermittently implanted into a point on the semiconductor wafer. Therefore, since a time interval of no ion implantation exists during the ion implantation, the temperature at the point during the ion implantation is alternately increased and decreased due to alternately repetition of the effect of an increase in temperature by the ion implantation and the effect of a decrease in temperature by heat transferring to the exterior system during the time interval of no ion implantation. Namely, the amount of damage during the ion implantation can be controlled by changing the ion beam scan frequency.

In particular, recently, it is considered that the control of the amount of damage during the ion implantation by changing the ion beam scan frequency in the hybrid scanning ion implanter is an effective method of improving the performance of a semiconductor product. Namely, the ion beam scan frequency of the hybrid scanning ion implanter is one of the ion implantation conditions set by the ion implanter before the ion implantation.

Hereinafter, diversity of allowable ranges of several physical quantities characterizing the ion implantation process in the hybrid scanning ion implanter and methods of securing the allowable ranges of several physical quantities will be exemplified. First, an example requiring sufficient preparation before the ion implantation will be described.

In typically well-used ion implantation processes including the above-described gate implantation process, in many cases, although there is a difference in amount of damage during the ion implantation to some extent, there may be no difference in performance of finally manufactured semiconductor products. On the other hand, in the above-described extension implantation process or an ion implantation process called a pre-amorphous process, in many cases, due to the difference in amount of damage during the ion implantation, there may be a difference in performance of finally manufactured semiconductor products.

As described above, the amount of damage during the ion implantation can be controlled by using the temperature of the semiconductor wafer, the beam size on the semiconductor wafer, and the ion beam scan frequency. Herein, the beam size is measured before ion implantation, and if the beam size is insufficient in terms of the amount of damage during the ion implantation, the beam size on the semiconductor wafer can be controlled by changing the parameters of the apparatus transporting the ions to the wafer. However, since some time is taken for the measurement and control of the beam size, in the case where the difference in amount of damage during the ion implantation does not influence the performance of finally manufactured semiconductor products, time is wasted in the measurement and control of the beam size in the ion implantation process, so that the measurement and control of the beam size are not appropriate. Therefore, if not necessary, the measurement and control of the beam size on the semiconductor wafer before the ion implantation are performed only in the case where the difference in amount of damage during the ion implantation causes the difference in performance of finally manufactured semiconductor products.

The examples of diversity of allowable ranges of several physical quantities characterizing the ion implantation process in the hybrid scanning ion implanter and the methods of securing the allowable ranges of several physical quantities will described. In addition, an example requiring countermeasures to the change in the physical quantity continuously occurring during the ion implantation will be described.

As described above, in the gate implantation process, the difference in performance of finally manufactured semiconductor products with respect to the difference in ion implantation dose is relatively small, but in the extension implantation process, the difference in performance of finally manufactured semiconductor products with respect to the difference in ion implantation dose is large. Herein, when the ions are to be implanted into the semiconductor wafer, in order to perform the ion implantation at a target position of the semiconductor wafer, in general, a resist mask is disposed on the semiconductor wafer, and the ion implantation is performed from the upper portion thereof. The resist mask is a thin film material having a pore structure including a large number of extremely fine pores. The porous portion of the resist mask is called an ion transparent region, and the other portion is called a resist region. The ion beam irradiated on the resist region of the resist mask does not reach the semiconductor wafer, and only the ion beam irradiated on the ion transparent region of the resist mask reaches the semiconductor wafer to be implanted into the semiconductor wafer. In this manner, the ion implantation according to the ion implantation conditions can be performed at the target positions over the entire surface of the semiconductor wafer.

In addition, as described above, as an example of the method of controlling the ion implantation dose, there is a method of measuring the beam current amount at a position of the semiconductor wafer before the ion implantation and controlling the speed of mechanically scanning the wafer based on the measured value of the beam current amount. Herein, when the beam is irradiated on the above-described resist mask, a portion of constituents of the resist mask is transported to the beamline to interact with the ion beam, so that some ions in the ion beam are scattered, neutralized, or subjected to valence conversion of ions. As a result, the ions may not reach the semiconductor wafer.

In this case, in comparison to a case before the ion implantation, the beam current amount is continuously changed during the ion implantation. Therefore, if the speed of mechanical scanning of the wafer is controlled based on the measured value of the beam current amount before the ion implantation, the ion implantation dose is changed. In the ion implantation process such as the extension implantation process where the difference in performance of finally manufactured semiconductor products with respect to the difference in ion implantation dose is large, a change in the above-described ion implantation dose is not allowable. In this case, the continuous change in beam current amount during the ion implantation in comparison to the change thereof before ion implantation is sensed by measuring the beam current amount during the ion implantation into the semiconductor wafer, and the speed of mechanically scanning the wafer is controlled based on the measured value of the beam current amount, so that the ion implantation dose can be accurately controlled.

Since the ion beam needs to be transported to the measurement device in order to perform the beam current measurement during the ion implantation, the ion beam is transported to the outside of the semiconductor wafer, and thus, in addition to time of the implantation into the semiconductor wafer, some time is taken for the beam current measurement during the ion implantation. Therefore, in the case where the difference in ion implantation dose does not influence the performance of finally manufactured semiconductor products, time is wasted in the beam current measurement in the ion implantation process, which is not preferred. Therefore, if not necessary, the beam current measurement during the ion implantation is performed only in the case where the difference in ion implantation dose causes the difference in performance of finally manufactured semiconductor products.

Herein, it should be noted that some time is required for a method of securing the physical quantities characterizing the ion implantation process and, in the case where the difference in the physical quantity does not cause the difference in performance of finally manufactured semiconductor products, the productivity of the semiconductor product is deteriorated by time required for the above-described method. Therefore, in order to improve the productivity of the semiconductor product, in each of the ion implantation processes, it is determined individually for each of the physical quantities characterizing the ion implantation process whether or not there is a need to employ the method of securing the physical quantity, and if necessary, the method of securing the physical quantity is employed within a necessary range. Since the employment of the method of securing the physical quantity can be determined for each of the ion implantation processes, the employment of the method of securing the physical quantity may be considered to be one of the ion implantation conditions set by the ion implanter before the ion implantation.

In addition, as described above, in the ion implantation process, it is important to determine the allowable values of the uniformity of physical quantities over the surface of the wafer which is required in the ion implantation. However, with respect to the physical quantities, the selection of the settings of allowance of the uniformity over the surface in the ion implantation by using the determined allowable value of the uniformity of physical quantities over the surface of the wafer may also be considered to be one of the ion implantation conditions.

In addition, among the ion implantation conditions, there is a physical quantity such as an ion type of which occurrence of a difference over the entire surface of the semiconductor wafer during the ion implantation is unlikely to be considered. Since the embodiment relates to the detection of the discharge event affecting the ion beam or the detection of the discharge event affecting the ion implantation conditions and relates to the change in physical quantities characterizing the ion implantation process temporarily occurring during the ion implantation, among the ion implantation conditions, the physical quantities of which occurrence over the entire surface of the semiconductor wafer during the ion implantation is unlikely to be considered may be excluded.

In addition, similarly, among the physical quantities characterizing the ion implantation process, there is also a physical quantity such as an ion implantation energy which may not be actually considered since the ions cannot completely reach the semiconductor wafer in the case where a change in the physical quantity occurs with the occurrence of the discharge event affecting the ion beam. In the embodiment, the physical quantity relates to detection of the discharge event affecting the ion beam or detection of the discharge event affecting the ion implantation conditions. Although these physical quantities need to be listed as the ion implantation conditions, these physical quantities may be excluded from the physical quantities characterizing the ion implantation process which cause the difference in performance of finally manufactured semiconductor products.

Therefore, in the hybrid scanning ion implanter, the below-described ion implantation conditions include: an ion implantation dose and an allowable value of the uniformity thereof over the surface of the wafer; an ion implantation angle and an allowable value of the uniformity thereof over the surface of the wafer; an ion beam scan frequency; an ion beam width in the wafer scanning direction and an allowable value of the uniformity thereof over the surface of the wafer; an ion beam width in the beam scanning direction and an allowable value of the uniformity thereof over the surface of the wafer; and whether or not to perform beam current measurement during ion implantation into the wafer (hereinafter, referred to as "existence of beam current measurement during the ion implantation into the wafer"). The ion implantation conditions may set before the ion implantation in the hybrid scanning ion implanter or may be controlled as needed.

In addition, among the above-described ion implantation conditions, the ion implantation dose, the ion implantation angle, the ion beam width in the wafer scanning direction and the ion beam width in the beam scanning direction are also the physical quantities characterizing the ion implantation process which cause the difference in performance of finally manufactured semiconductor products when the discharge event affecting the ion beam occurs. Therefore, as described above, it is required to change the above-described physical quantities for each ion implantation process. In addition, in some ion implantation processes, it is required that the uniformity of the above-described physical quantities over the surface is less than a threshold value.

In addition, in some ion implanters, it is not necessary that both of the beam scanning direction and the wafer scanning direction exist. For example, in an ion implanter employing a method called a two-dimensional mechanical scan method, wafer scanning is performed two-dimensionally. In addition, in an ion implanter employing a method called a ribbon beam method, wafer scanning is performed in a direction perpendicular to an ion beam having a larger width in one direction. In addition, in an ion implanter employing a method called a raster scan method, beam scanning is performed two-dimensionally.

Ion implantation methods and ion implanters according to the embodiments may be appropriately applied to all the above-described ion implanters. However, hereinafter, description will be made by using a hybrid scanning ion implanter as a representative example.

In the cases of using other types of ion implanters, the following description may be appropriately changed according to meaning and content. For example, if the description about the "ion beam width in the wafer scanning direction" in the example of the hybrid scanning ion implanter is to be applied to an ion implanter employing a method called a raster scan method, since there is no concept of the "wafer scanning" in the raster scan method, the ion beam width in the wafer scanning direction may be neglected. It should be noted that, even in an ion implantation using any types of ion implanters, if the discharge event affecting the ion beam occurs, there is a physical quantity characterizing the ion implantation process which cause the difference in performance of finally manufactured semiconductor products. Therefore, the changing of the above-described physical quantities for each of the ion implantation processes is required, and in some ion implantation processes, the uniformity of the above-described physical quantities over the surface is required so as to be below a certain threshold value.

According to the embodiment described hereinafter, in the case where the above-described ion implantation conditions are variously set by the ion implantation process, by detecting the discharge event affecting the ion beam or the discharge event affecting the ion implantation conditions in any cases and appropriately coping with the discharge event, the above-described physical quantities characterizing the ion implantation process required in the ion implantation process can be implemented on the semiconductor wafer at the given conditions without deterioration in productivity of the semiconductor product. In other words, according to the embodiment described hereinafter, an ion implantation method of determining the beam state in the ion implantation into the wafer during the ion implantation into the wafer may be provided.

Herein, it should be noted that, the uniformity itself of physical quantities characterizing the above-described ion implantation process over the surface of the wafer is also one of the ion implantation conditions, and the method of detecting discharge event affecting the ion beam and the countermeasures thereto are changed according to settings of the ion implantation conditions. In other words, although there is a difference in the above-described physical quantities characterizing the ion implantation process to some extent, in the case where there is no difference in performance of finally manufactured semiconductor products, the allowable value of the uniformity of the physical quantities over the surface of the wafer included in the ion implantation conditions is set to be large. In addition, if the change in the physical quantity temporarily occurring during the ion implantation is known to be below the allowable value, since the event is not the discharge event affecting the ion beam, the detection thereof is not performed, so that the physical quantity can be implemented on the semiconductor wafer at the given conditions without deterioration in productivity of the semiconductor product.

Hereinafter, embodiments of the present invention will be described in detail with reference to the drawings. In the description of the drawings, the same components are denoted by the same reference numerals, and the redundant description thereof is appropriately omitted. The configurations described hereinafter are exemplary ones, and thus, the present invention is not limited thereto. In addition, in the description hereinafter, a semiconductor wafer is exemplified as an object on which ion implantation is performed. However, other materials or members may be used as the object.

First Embodiment

Figure 1B:
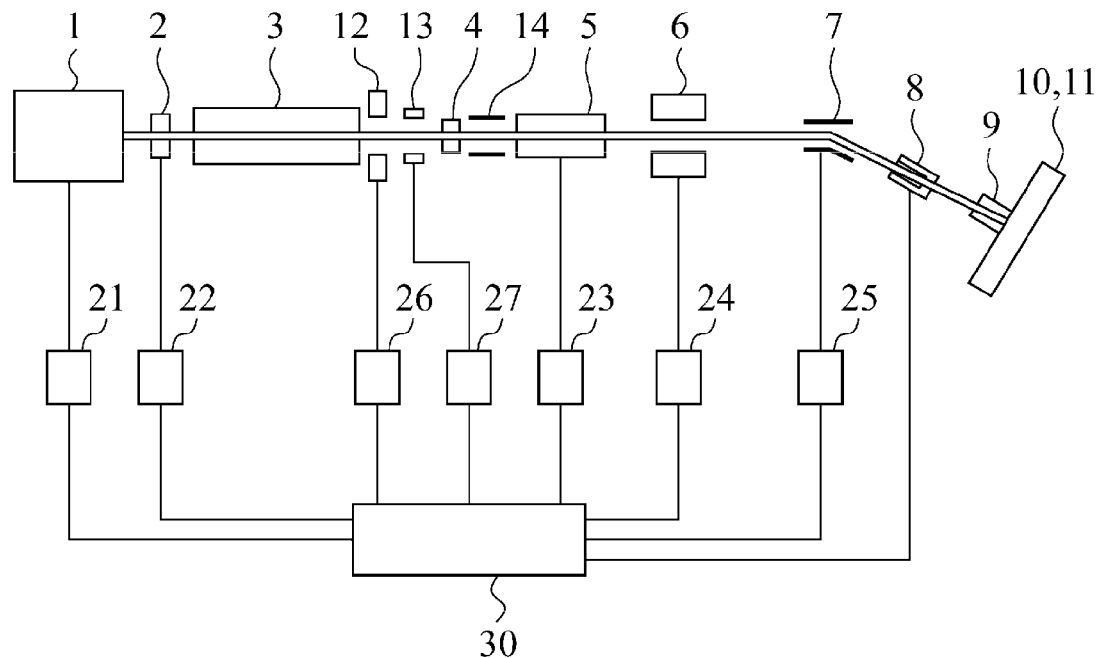
FIG. 1B is a schematic side view illustrating the configuration of the hybrid scanning ion implanter according to the first embodiment.

FIG. 1A is a schematic plane view illustrating a configuration of a hybrid scanning ion implanter according to a first embodiment, and FIG. 1B is a schematic side view illustrating the configuration of the hybrid scanning ion implanter according to the first embodiment.

A hybrid scanning ion implanter (hereinafter, sometimes referred to as an "ion implanter") 100 according to the embodiment is configured so that an ion beam extracted from an ion source 1 by an extraction electrode 2 passes through a beamline reaching a semiconductor wafer 10. Amass analysis magnet device 3, amass analysis slit 4, a beam scanner 5, and a wafer processing chamber (ion implantation chamber) are arranged along the beamline. A mechanical scanning device 11 which holds the semiconductor wafer 10 is arranged in the wafer processing chamber. The ion beam extracted from the ion source 1 is guided along the beamline to the semiconductor wafer 10 on a holder arranged at an ion implantation position of the wafer processing chamber.

The ion beam reciprocally scans in one direction by using the beam scanner 5 and is paralleled due to a function of a parallel lens 6 to be guided to the semiconductor wafer 10. In addition, the ion implanter according to the embodiment mechanically scans the semiconductor wafer 10 in the direction perpendicular to the ion beam scanning direction to drive ions into the semiconductor wafer 10. In the ion implanter 100 illustrated in FIGS. 1A and 1B, purity of ion energy is improved by bending the ion beam by using an angular energy filter 7. However, this is an example, and the angular energy filter 7 may not be used.

The semiconductor wafer 10 is mounted on the mechanical scanning device 11 which is configured to include a mechanism holding the semiconductor wafer 10. FIG. 1A illustrates that the semiconductor wafer 10 together with the mechanical scanning device 11 is reciprocally moved in the up-down direction intersecting the surface of the paper, and FIG. 1B illustrates that the semiconductor wafer 10 together with the mechanical scanning device 11 is reciprocally moved on the surface parallel to the paper.

In addition, in a current typically-used ion implanter, a beam lens is arranged on the beamline for the purpose of controlling a shape of ion beam on the semiconductor wafer 10 by applying a convergence or divergence force to the ion beam to control transverse and longitudinal shapes of ion beam. In FIGS. 1A and 1B, as an example of the beam lens, an electrostatic lens 12 to which a DC voltage is applied is arranged. The function of the electrostatic lens 12 having an electrostatic force is to apply the convergence force and the divergence force to the ion beam, and various shapes thereof may be employed. FIGS. 1A and 1B illustrate an example thereof. However, this is exemplary one, and the shape of the electrostatic lens 12 is not limited to the illustrated shape. In addition, in some cases, the electrostatic lenses 12 may be arranged at various positions between the ion source 1 and the semiconductor wafer 10. In FIGS. 1A and 1B, one electrostatic lens 12 is arranged, and this is exemplary one. A plurality of the electrostatic lenses 12 may be arranged.

In the current typically-used ion implanters, in many cases, a beam steering device is arranged on the beamline for the purpose of improving transport efficiency from the ion source 1 to the semiconductor wafer 10 by applying an electromagnetic force to the ion beam to exert a drift force in a direction so as to allow a trajectory of the ion beam to be parallel-translated. In FIGS. 1A and 1B, as an example of the beam steering device, an electrostatic beam steering device 13 to which a DC voltage is applied is arranged. The function of the electrostatic beam steering device 13 is to exert the drift force in a direction of the ion beam by an electrostatic force to allow the ion beam to be parallel-translated, and various shapes thereof may be employed. FIGS. 1A and 1B illustrate an example thereof. However, this is exemplary one, and the shape of the electrostatic beam steering device 13 is not limited to the shape. In addition, in some cases, the electrostatic beam steering device 13 may be arranged at various positions between the ion source 1 and the semiconductor wafer 10. In FIGS. 1A and 1B, one electrostatic beam steering device 13 is arranged, and this is exemplary one. A plurality of the electrostatic beam steering devices 13 may be arranged.

The ion implanter may also be configured so that the purpose of controlling the shape of ion beam on the semiconductor wafer 10 and the purpose of improving the transport efficiency from the ion source 1 to the semiconductor wafer 10 can be satisfied by a single device.

It should be noted that influence on the physical quantities characterizing the ion implantation process in the ion implantation method according to the embodiment, for example, an ion implantation dose, an ion implantation angle, an ion beam width in the wafer scanning direction, and an ion beam width in the beam scanning direction in a hybrid scanning ion implanter is different according to the function of each component on the beamline. For example, since the electrostatic beam steering device 13 improves the transport efficiency from the ion source 1 to the semiconductor wafer 10, beam current on the semiconductor wafer 10 can be controlled due to the influence of the electrostatic beam steering device 13, but the ion implantation angle, the ion beam width in the wafer scanning direction, and the ion beam width in the beam scanning direction cannot be controlled. In other words, if a DC voltage applied to the electrostatic beam steering device 13 is changed when the ions are implanted on the semiconductor wafer 10, the ion implantation dose is changed, but the ion implantation angle, the ion beam width in the wafer scanning direction, and the ion beam width in the beam scanning direction are not changed.

On the other hand, since the parallel lens 6 allows the scanned ion beam to be paralleled, the ion implantation angle on the semiconductor wafer 10 can be controlled due to the influence of the parallel lens 6, but the ion beam width in the wafer scanning direction and the ion beam width in the beam scanning direction cannot be controlled. With respect to the influence of the parallel lens 6 on the beam current on the semiconductor wafer 10, a scanning range length in the beam scanning direction is defined by the ion beam paralleled by the parallel lens. Therefore, if a degree of parallelizing is changed, the scanning range length in the beam scanning direction is secondarily and slightly changed, so that the beam current on the semiconductor wafer 10 is also secondarily and slightly changed. Therefore, if a DC voltage applied to the parallel lens 6 is changed when the ions are implanted on the semiconductor wafer 10, the ion implantation angle and the ion implantation dose are changed, but the ion beam width in the wafer scanning direction and the ion beam width in the beam scanning direction are not changed. The change in ion implantation dose is a secondary change due to the change in the DC voltage applied to the parallel lens 6. Therefore, in some cases, if an allowable value of uniformity of the ion implantation dose over the surface of the wafer is large to some extent, the change in ion implantation dose may be neglected when the DC voltage applied to the parallel lens 6 is changed.

Namely, it is important to determine which one of the physical quantities characterizing the ion implantation process in the embodiment, for example, an ion implantation dose, an ion implantation angle, an ion beam width in the wafer scanning direction, and an ion beam width in the beam scanning direction in a hybrid scanning ion implanter gives a difference in performance of finally manufactured semiconductor products, to determine how large the allowable value of the uniformity thereof over the surface of the wafer is for each of the ion implantation processes, and to specify the components on the beamline which exert influence exceeding the allowable value of the uniformity of physical quantities over the surface of the wafer due to the change thereof.

In addition, as illustrated in FIGS. 1A and 1B, a beam dump electrode 14 may be arranged in the ion implanter. The beam dump electrode 14 is an electrode which temporarily shifts a beam from the beamline to prevent the beam from being incident on the semiconductor wafer 10 in order to prevent an unintended beam from being incident on the semiconductor wafer 10. The function of the beam dump electrode 14 is to temporarily shift the beam from the beamline by applying a high voltage, and various shapes may be employed. FIGS. 1A and 1B illustrate an example thereof. However, this is exemplary one, and the shape of the beam dump electrode 14 is not limited to the illustrated shape.

In FIGS. 1A and 1B, the beam dump electrode 14 is arranged between the mass analysis slit 4 and the beam scanner 5. However, this is an exemplary one, and the beam dump electrode 14 may be arranged at various positions between the ion source 1 and the semiconductor wafer 10. In addition, in some cases, the beam dump electrode 14 may not be arranged, and the beam may be temporarily shifted from the beamline by temporarily applying a high voltage to the other devices arranged on the beamline so that the beam is prevented from being incident on the semiconductor wafer 10. For example, the beam may be temporarily shifted from the beamline by temporarily applying a high voltage to the beam scanner 5 so that the beam can be prevented from being incident on the semiconductor wafer 10.

In the embodiment, in a case where various ion implantation conditions are set, the state of ion beam during the ion implantation into the wafer is determined during the ion implantation into the wafer by detecting an event having a possibility of discharge affecting the ion beam. The "event having a possibility of discharge" affecting the ion beam includes an event of discharge itself, an event which does not directly indicate the occurrence of discharge but indirectly indicates the occurrence of discharge. For example, an event where a variation in power of the power supply starts to occur and which indicates that discharge does not occur at the time of detection but discharge is likely to occur in the future is also included. Hereinafter, sometimes, the "event having a possibility of discharge" is appropriately referred to as a "discharge event".

As the operations of the ion implanter 100 according to the embodiment, after the detection of the above-described discharge event, the above-described ion beam is allowed to be saved from the semiconductor wafer 10, and after the discharge event ends, the ions are implanted into the semiconductor wafer 10 again. A mechanism of temporarily excluding the beam from the beamline by temporarily applying a high voltage to the beam dump electrode 14 illustrated in FIGS. 1A and 1B to prevent the beam from being incident on the semiconductor wafer 10 is considered to be an example of a saving mechanism. In this case, after the discharge event ends, the high voltage temporarily applied to the beam dump electrode 14 is removed, so that the beam returns to the beamline. Next, the beam is allowed to be incident on the semiconductor wafer 10 again, so that the ions can be implanted again into the semiconductor wafer 10.

In a case where the ions are implanted into the semiconductor wafer 10 by using the ion implanter 100 illustrated in FIGS. 1A and 1B, actually, preparation and checking are needed before the ion implantation into the semiconductor wafer 10 in order to check a quality of the ion beam, to check whether or not a desired ion beam current amount is obtained, or to check temporal stability of the ion beam. Hereinafter, a procedure for the preparation and checking is referred to as "beam setup". In ion implanter 100 illustrated in FIGS. 1A and 1B, the ion beam is measured by using a wafer area beam measurement device 9 in the beam setup period, and after that, the semiconductor wafer 10 is set. In FIGS. 1A and 1B, although the wafer area beam measurement device 9 is configured to be movable, this is an exemplary one. A non-movable type wafer area beam measurement device 9 may be used.

In addition, if needed, an ion implantation angle in the beam setup period may also be measured. If the ion implantation angle in the beam scanning direction is exemplified, for example, a thin slit shaped device (not illustrated) is inserted into the beamline after the angular energy filter 7, and the ion beam current amount at each position following the device is measured by using the wafer area beam measurement device 9, so that the ion implantation angle can be measured. In addition, the method of measuring the ion implantation angle is an exemplary one. Besides, various methods of measuring the ion implantation angle may be considered.

In addition, if needed, an ion beam width in the wafer scanning direction and an ion beam width in the beam scanning direction may also be measured by using the wafer area beam measurement device 9 which can two-dimensionally measure the ion beam current amount in the beam setup period. In addition, the method of measuring the ion beam widths is an exemplary one. Other methods of measuring the ion beam widths such as a method of measuring the ion beam current amount by intentionally changing a DC voltage applied to the angular energy filter 7 may be considered.

In this manner, by using various measurement methods in the beam setup period, the physical quantities characterizing the ion implantation process considered in the present invention, that is, the ion implantation dose, the ion implantation angle, the ion beam width in the wafer scanning direction, the ion beam width in the beam scanning direction can be measured. In addition, after the measurement, the allowable value of uniformity of the physical quantities over the surface of the wafer may also be set as an ion implantation condition.

In addition, the ion implanter 100 according to the embodiment is configured such that a dose cup 8 is installed in the wafer processing chamber to measure a beam current during the ion implantation if needed. As a specific example of the dose cup 8, a Faraday cup or a calorimeter is used. In FIGS. 1A and 1B, the dose cups 8 are installed at the two corresponding sites in the horizontal direction of the semiconductor wafer 10 before the semiconductor wafer 10. However, this is an exemplary one. If the installation position is a position where the beam current amount during the ion implantation can be measured, the dose cups 8 may be installed at any positions after the semiconductor wafer 10 and may be installed on the plane including the semiconductor wafer 10. In addition, in FIGS. 1A and 1B, the two dose cups 8 are installed at the two sides in the ion scan direction. However, this is an exemplary one. A single dose cup or three or more dose cups may be installed.

As described above, as an example of a method of controlling the ion implantation dose in the hybrid scanning ion implanter, there is a method of measuring the beam current amount at the position of the semiconductor wafer 10 in the beam setup period and controlling the speed of mechanical scanning of the semiconductor wafer 10 based on the measured value of the beam current amount. Herein, the method will be described in detail with reference to FIGS. 1A and 1B. First, in the beam setup period, while the ion beam scans to the position of the dose cup 8, the beam current amount is measured by using the dose cup 8 and the wafer area beam measurement device 9 to obtain a factor of proportionality (hereinafter, referred to as a "cup correction value"). During the ion implantation into the semiconductor wafer 10, although it is difficult to use the wafer area beam measurement device 9, since the beam current amount can be measured by the dose cup 8, the beam current amount implanted into the semiconductor wafer 10 can be estimated by using the measured value and the above-described cup correction value.

Herein, if there is no change between the beam current amount measured by the dose cup 8 during the ion implantation and the beam current amount measured by the dose cup 8 in the beam setup period, the beam current amount implanted into the semiconductor wafer 10 estimated by using the cup correction value is calculated to be equal to the beam current amount measured by the wafer area beam measurement device 9 in the beam setup period. Next, the semiconductor wafer 10 is mechanically scanned at the speed set in the beam setup period, so that the ion implantation dose amount in accordance with the setting can be obtained as a result.

In addition, due to the influence of the ion implantation on the resist mask described above, a portion of constituents of the resist mask is transported to the beamline to interact with the ion beam, so that some ions in the ion beam are scattered, neutralized, or subjected to valence conversion of ions. As a result, in a case where the ions do not reach the semiconductor wafer, in comparison to the beam setup period, the beam current amount is continuously changed during the ion implantation. Even in this case, the beam current is measured by the dose cup 8 during the ion implantation, and a cup correction value is multiplied thereto, so that the beam current amount implanted into the semiconductor wafer 10 can be estimated. Therefore, the semiconductor wafer 10 is not mechanically scanned at the speed set in the beam setup period, but the semiconductor wafer 10 is mechanically scanned at the speed newly set according to a continuous change in beam current amount during the ion implantation, so that the ion implantation dose in accordance with the settings can be obtained as a result.

Although the beam needs to scan to the dose cup 8 in order to perform the beam current measurement by using the dose cup 8 during the ion implantation, as clearly illustrated in FIGS. 1A and 1B, the beam needs to scan to the outside of the semiconductor wafer 10. This means that some time for the purpose of the beam current measurement during the ion implantation is taken in addition to the implantation time of ion implantation into the semiconductor wafer 10. Therefore, for example, within a range where there is influence of the ion implantation on the above-described resist mask, in a case where the difference in ion implantation dose does not influence the performance of finally manufactured semiconductor products, time is wasted in implementing countermeasures in the ion implantation process, so that the beam current measurement during the ion implantation may not be preferred. In other words, if not necessary, the beam current measurement during the ion implantation is preferably performed in a case where the difference in ion implantation dose amount causes the difference in performance of finally manufactured semiconductor products.

The embodiment relates to method of detecting a discharge event affecting the ion beam or the discharge event affecting the ion implantation conditions, and in other words, the embodiment relates to a method of determining a beam state in the ion implantation into the wafer during the ion implantation into the wafer. An apparatus for measuring the above-described beam current may be used as a method of detecting the discharge event. Namely, even during the ion implantation, in a case where the beam current amount reaching the position of the semiconductor wafer 10 is decreased, the discharge event is detected. As described above, during the ion implantation into the semiconductor wafer 10, it is difficult to use the wafer area beam measurement device 9, so that the beam current amount of the ion beam reaching the position of the semiconductor wafer 10 may not be directly measured. However, the beam current is measured by the dose cup 8 during the ion implantation, and the cup correction value is multiplied thereto, so that the beam current amount implanted into the semiconductor wafer 10 can be indirectly estimated. The discharge event is detected from the estimated physical quantity. Therefore, in order to detect the discharge event, it is necessary which the ion beam always scans to the position of the dose cup 8 during the ion implantation. Namely, for example, within a range where there is influence of the ion implantation on the above-described resist mask, even in a case where the difference in ion implantation dose does not influence the performance of finally manufactured semiconductor products, sometime required for the purpose of the beam current measurement during the ion implantation is taken in addition to the implantation time of ion implantation into the semiconductor wafer 10. As a result, the productivity of the semiconductor product is unnecessarily deteriorated.

In the above description, the examples where the productivity of the semiconductor product is unnecessarily deteriorated in the case where the method of detecting the discharge event affecting the ion beam or the discharge event affecting the ion implantation conditions or the method of determining the beam state in the ion implantation into the wafer during the ion implantation into the wafer is performed through only the beam current measurement have been described. Furthermore, in this case, when a desired ion beam cannot be obtained, it is necessary to note that all events that the measured value of the beam current measured by the dose cup 8 is less than a predetermined value are considered to be detected as the discharge event in the same way. Namely, due to the influence of the ion implantation on the resist mask described above, a portion of constituents of the resist mask is transported to the beamline to interact with the ion beam, so that some ions in the ion beam are scattered, neutralized, or subjected to valence conversion of ions. In addition, if a large portion of the ions in the ion beam do not reach the semiconductor wafer 10, in a case where the detection of the discharge event affecting the ion beam is performed by using only the beam current measurement device, even in a case where the beam current is decreased due to a factor other than the discharge event, an event may be erroneously detected as the discharge event, and thus, the countermeasures thereto is made. As a result, the productivity of the semiconductor product is unnecessarily deteriorated. In other words, the detection by the dose cup 8 that the measured value of the beam current is less than a predetermined value is merely the detection of a possibility of an elementary discharge process. In addition, the detected elementary discharge process is merely indication of a possibility of the discharge event affecting the ion beam or the discharge event affecting the ion implantation conditions.

As described above, in the extension implantation process, the difference in performance of finally manufactured semiconductor products with respect to the difference in ion implantation dose is large. Therefore, even in a case where the beam current is decreased due to a factor other than the discharge event, it may be considered that, after the detection of the above-described event, the ion beam is saved from the semiconductor wafer 10, and after the event ends, the ions are implanted into the semiconductor wafer 10 again. However, similarly to the case of the gate implantation process, even in a case where the difference in performance of finally manufactured semiconductor products with respect to the difference in ion implantation dose is relatively small, if the ion beam is saved from the semiconductor wafer 10 in a case where the beam current is decreased due to a factor other than the discharge event and, after the event ends, the ions are implanted into the semiconductor wafer 10, the productivity of the semiconductor product is unnecessarily deteriorated. Namely, the consideration of the detection of the possibility of elementary discharge process detected by the dose cup 8 to be the discharge event affecting the ion beam or the discharge event affecting the ion implantation conditions may be appropriate in the extension implantation process, but the consideration is not appropriate in the gate implantation process.

In the ion implantation method according to the embodiment, in the ion implantation process of transporting the ions from the ion source to the wafer to implant the ions into the wafer, a combination of a plurality of methods of detecting a possibility of elementary discharge process is used. In addition, the ion implantation conditions are set before the ion implantation, and a discharge event detection method appropriate to each of the ion implantation conditions is used. In addition, the discharge event affecting the ion implantation conditions is detected during the ion implantation into the wafer without unnecessary deterioration in productivity of the ion implantation, or the beam state in the ion implantation into the wafer is determined during the ion implantation into the wafer.

The above-described extension implantation process and gate implantation process are exemplified in the description. Since the ion implantation conditions used in the extension implantation process and the ion implantation conditions used in the gate implantation process are different, each ion implantation condition may be set before the ion implantation. Therefore, with respect to the ion implantation conditions used in the extension implantation process and the ion implantation conditions used in the gate implantation process, the ion implantation conditions are set before the ion implantation, and a discharge event detection method appropriate to each of the ion implantation conditions is used, so that the discharge event affecting the ion implantation conditions can be detected during the ion implantation into the wafer without unnecessary deterioration in productivity of the ion implantation.

In addition, as described above, in a case where the method of detecting the discharge event affecting the ion beam is performed by using only the beam current measurement, if the ion beam scan frequency is low, the average time from the occurrence of discharge to the detection of discharge is too long, so that the discharge event may not be detected; and even in a case where the ion beam width in the wafer scanning direction and the ion beam width in the beam scanning direction are changed without a change in ion beam current amount, the discharge event may not be detected.

In one of the ion implantation methods according to the embodiment, in addition to the beam current measurement, a method of detecting a possibility of elementary discharge process using power supply voltage measurement is used. Namely, for example, in FIGS. 1A and 1B, the discharge event affecting the ion beam is detected by using the determination as to how much the measured values of the power supply voltages applied to power supply voltage measurement units 21 to 27 which measure the power supply voltages of each power supply of the ion source 1, the extraction electrode 2, the beam scanner 5, the parallel lens 6, the angular energy filter 7, the electrostatic lens 12, and the electrostatic beam steering device 13 are deviated from the setting values thereof in addition to the determination as to whether or not the measured value of the beam current measured by the dose cup 8 is less than a predetermined value. As described later in detail, the discharge event affecting the ion beam for each of variously-set ion implantation conditions can be detected by using the determination using the measured values of the beam current and the determination as to the deviation of the measured values of the power supply voltages from the setting values thereof.

The above-described components on the beamline are exemplary ones, and the embodiment is not limited thereto. It should be noted that, in one of the ion implantation methods according to the embodiment, the determination as to the deviation of the measured value of the power supply voltage from the setting value thereof is used with respect to each of the components on the beamline. Needless to say, with respect to the component on the beamline where the discharge event affecting the ion beam does not occur, the determination as to the deviation is unnecessary by nature. For example, in FIGS. 1A and 1B, the mass analysis magnet device 3 uses a low-voltage high-current power supply. Since the setting voltage is low, a discharge event affecting the ion beam does not occur by nature, so that the determination as to the deviation is not necessary.

Herein, in the method of detecting a possibility of elementary discharge process using the measured value of the beam current measured by the dose cup 8, the measurement can be performed at a measurement interval inversely proportional to the ion beam scan frequency by nature. Namely, in a case where the ion beam scan frequency is high, the information on the discharge event affecting the ion beam can be obtained for a very short time. For example, in a case where the ion beam scan frequency is 1 kHz, the information on the discharge event affecting the ion beam can be obtained in units of 1 msec. On the other hand, as described above, in a case where the ion beam scan frequency is low, since the average time from the occurrence of discharge to the detection of discharge is too long, the information on the discharge event affecting the ion beam cannot be obtained practically. For example, in a case where the ion beam scan frequency is 1 Hz, the information on the discharge event affecting the ion beam is obtained merely in units of 1 sec. Since typical discharge duration of the component on the beamline is from 50 msec to 200 msec, the information on the discharge event affecting the ion beam cannot be obtained practically.

On the other hand, the method of detecting a possibility of elementary discharge process using the power supply voltage measurement has a feature in that the measurement can be performed at a certain measurement interval. In principle, the measurement can be performed at a very short measurement interval. However, by taking into consideration technical difficulty and costs, the measurement interval of a control system typically used for the hybrid scanning ion implanter is from 5 msec to 20 msec. Since the measurement interval is shorter than the typical discharge duration of the components on the beamline, that is, a time interval of from 50 msec to 200 msec, the information on the discharge event affecting the ion beam can be obtained. However, the measurement interval is slightly longer than that of the case where the ion beam scan frequency is high and the discharge detection method using the measured value of the beam current measured by the dose cup 8 is used. In other words, in the case of using only the method of detecting a possibility of elementary discharge process using the power supply voltage measurement, in the ion implantation process (for example, an extension implantation process and the like) where the difference in performance of finally manufactured semiconductor products with respect to the difference in ion implantation dose is large, the time interval from the time of the occurrence of the discharge event affecting the ion beam to the time of saving the ion beam from the semiconductor wafer 10 is slightly long. Namely, there is a case where the difference in performance of finally manufactured semiconductor products occurs due to the influence of the discharge event.

In summary, the method of detecting a possibility of elementary discharge process by using the dose cup 8 using the measured value of the beam current which can be measured at a measurement interval inversely proportional to the ion beam scan frequency and the method of detecting a possibility of elementary discharge process using the power supply voltage measurement which can be performed at a certain measurement interval have their features by nature. Therefore, in a case where various ion implantation conditions are set before the ion implantation, by detecting the discharge event affecting the ion beam by the control method corresponding to the feature according to one of the ion implantation methods according to the embodiment, and by appropriately coping with the discharge event, the physical quantities characterizing the ion implantation process required in the ion implantation process can be implemented on the semiconductor wafer at the given conditions without deterioration in productivity of the semiconductor product. In addition, in a case where various ion implantation conditions are set before the ion implantation, it may be determined by the control method corresponding to the feature according to one of the ion implantation methods according to the embodiment without deterioration in productivity of the semiconductor product that the beam state in the ion implantation into the wafer is abnormal.

Figure 2:
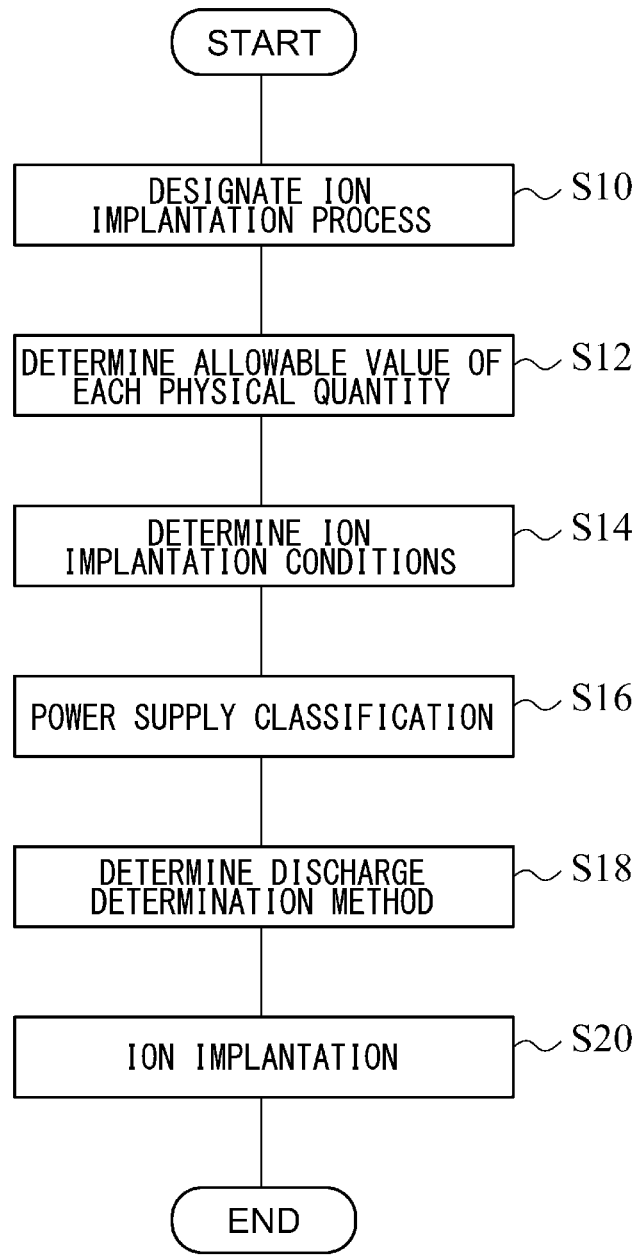
FIG. 2 is a flowchart illustrating an ion implantation method according to the first embodiment.

Now, a procedure of the ion implantation process according to the embodiment will be described with reference to FIG. 2. FIG. 2 is a flowchart illustrating an ion implantation method according to the first embodiment.

As described above, the method of detecting the discharge event affecting the ion beam varies with the settings of each of the ion implantation conditions set before the ion implantation. In a case where an ion implantation process of a semiconductor manufacturing process is designated (S10), physical quantities characterizing the ion implantation process are designated. For example, in the hybrid scanning ion implanter, as the physical quantities characterizing the ion implantation process, there are physical quantities such as the ion implantation dose, the ion implantation angle, the ion beam width in the wafer scanning direction, and the ion beam width in the beam scanning direction. In one of the ion implantation methods according to the embodiment, first, with respect to the ion implantation dose, the ion implantation angle, the ion beam width in the wafer scanning direction, and the ion beam width in the beam scanning direction, allowable values of the uniformity of each physical quantity over the surface of the wafer are set (S12). The allowable value is selected so that there is no difference in performance of finally manufactured semiconductor products mainly or the productivity of the semiconductor product is high in terms of as to how many semiconductor products of which performance falls in an allowable range of the semiconductor product among the finally manufactured semiconductor products can be manufactured within a unit time. However, external factors such as the situation of the ion implanter and the tightness of the semiconductor product manufacturing may be changed. Herein, it should be noted that, since the physical quantities characterizing the ion implantation process and the allowable value of the uniformity thereof over the surface of the wafer can be determined before the ion implantation in any ways, the ion implantation can be controlled in accordance with the determined values.

Next, the remaining ion implantation conditions are set (S14). For example, in the ion implantation conditions of the hybrid scanning ion implanter, the remaining ion implantation conditions including the ion beam scan frequency and the existence of beam current measurement during the ion implantation into the wafer are set.

The above description is summarized by exemplifying the hybrid scanning ion implanter. In the embodiment, when an ion implantation process of a semiconductor manufacturing process is designated, first, as the ion implantation conditions, in addition to the set ion beam scan frequency, and setting of any one of the ion implantation methods as to whether or not to perform the beam current measurement during the ion implantation into the wafer, the physical quantities required for the ion implantation, specifically, the ion implantation dose, the ion implantation angle, the ion beam width in the wafer scanning direction, the ion beam width in the beam scanning direction, and the allowable value of the uniformity of physical quantities over the surface of the wafer are determined.

Next, in the procedure according to the embodiment, the power supplies are classified (S16). The method of classifying the power supplies will be described later in detail. The classification varies with the above-described ion implantation conditions, but is not fixed. Namely, in the embodiment, the allowable value of the uniformity of the physical quantities required for the ion implantation, specifically, the ion implantation dose, the ion implantation angle, the ion beam width in the wafer scanning direction, the ion beam width in the beam scanning direction over the surface of the wafer is determined, and the setting of allowance of the uniformity over the surface in the ion implantation is selected according to the determined allowable value of the uniformity of physical quantities over the surface of the wafer, and the ion implantation is performed by using the selected setting of allowance of the uniformity over the surface in the ion implantation.

Next, in the procedure according to the embodiment, the discharge determination method is determined (S18). The discharge determination method varies with the above-described ion implantation conditions or power supply classification, but it is not fixed.

Next, in the procedure according to the embodiment, the ion implantation into the semiconductor wafer 10 is started (S20).

In summary, in the ion implantation method according to the embodiment, the ion implantation conditions are determined before the ion implantation in advance, and a plurality types of the discharge detection methods are used according to the ion implantation conditions. In a case where each of the ion implantation conditions set before the ion implantation is variously set, the discharge event affecting the ion beam can be detected by using the ion implantation method in any cases, and thus, it is possible to appropriately cope with the discharge event. As a result, the physical quantities characterizing the ion implantation process required in the ion implantation process can be implemented on the semiconductor wafer at the given conditions without deterioration in productivity of the semiconductor product.

Next, an example of power supply classification according to the embodiment will be described with reference to FIG. 3. FIG. 3 is a diagram illustrating an example of power supply classification of a hybrid scanning ion implanter.

In the embodiment, as the method of detecting a possibility of elementary discharge process using the power supply voltage measurement, a plurality of the power supplies installed on the beamlines are individually subjected to the power supply voltage measurement. In addition, as illustrated in FIG. 3, the above-described plurality of the power supplies, which are subject to the power supply voltage measurement, can be classified in advance into a plurality of types according to a degree of influence of the power supplies on the ion beam when the power supplies are discharged, that is, a degree of influence on the physical quantities characterizing the ion implantation process required in the ion implantation process, specifically, the ion implantation dose, the ion implantation angle, the ion beam width in the wafer scanning direction, and the ion beam width in the beam scanning direction. In FIG. 3, the ion beam width in the beam scanning direction and the ion beam width in the wafer scanning direction are denoted by a horizontal beam with and a vertical beam width, respectively.

In FIG. 3, the power supplies affecting the ion implantation dose include the ion source 1, the extraction electrode 2, the beam scanner 5, the parallel lens 6, and the electrostatic beam steering device 13. In addition, the power supplies affecting the ion implantation angle include the beam scanner 5, the parallel lens 6, and the angular energy filter 7. In addition, the power supplies affecting the ion beam width in the wafer scanning direction and the ion beam width in the beam scanning direction include the ion source 1, the extraction electrode 2, and the electrostatic lens 12. This power supply classification is an exemplary one corresponding to the components illustrated in FIGS. 1A and 1B. The power supply classification varies with the number and types of the components on the beamline.

Herein, it should be noted that the power supply classification varies with the ion implantation conditions as described above. Particularly, if the allowable value of uniformity of the physical quantities characterizing the ion implantation process listed above, that is, the ion implantation dose, the ion implantation angle, the ion beam width in the wafer scanning direction, the ion beam width in the beam scanning direction over the surface of the wafer is different, the estimation of influence of the case where the power supply is discharged is different naturally. In the ion implantation process where the difference in performance of finally manufactured semiconductor products with respect to the difference in ion implantation dose is large, for example, in a case where discharge of the electrostatic beam steering device 13 is not subject to the detection thereof and the typical ion implantation continues to be performed, if the error of the ion implantation dose is 2%, the uniformity of the ion implantation dose over the surface of the wafer is allowable below 1%. In this case, the electrostatic beam steering device 13 needs to be treated as a component affecting the ion implantation dose. On the other hand, in the ion implantation process where the difference in performance of finally manufactured semiconductor products with respect to the difference in ion implantation dose is small, the uniformity of the ion implantation dose over the surface of the wafer may be allowable up to 10%. In this case, the electrostatic beam steering device 13 is not treated as a power supply affecting the ion implantation dose.

Next, another example of power supply classification according to a modified example of the embodiment will be described with reference to FIG. 4. FIG. 4 is a diagram illustrating another example of power supply classification of the hybrid scanning ion implanter. By comparing FIG. 3 and FIG. 4, the power supplies affecting the ion implantation dose in FIG. 3 include the ion source 1, the extraction electrode 2, the beam scanner 5, the parallel lens 6, and the electrostatic beam steering device 13, and the power supplies affecting the ion implantation dose in FIG. 4 include only the ion source 1, the extraction electrode 2, and the beam scanner 5. In addition, the power supplies affecting the ion beam width in the wafer scanning direction in FIG. 3 include the ion source 1, the extraction electrode 2, and the electrostatic lens 12, and the power supplies affecting the ion beam width in the wafer scanning direction in FIG. 4 include only the ion source 1 and the extraction electrode 2.

The difference varies with the settings of the individual ion implantation conditions set before the ion implantation. Namely, in the classification illustrated in FIGS. 3 and 4, only the discharge event affecting the ion beam or the discharge event affecting the ion implantation conditions are allowed to be detected for each of the ion implantation conditions in terms of performance of finally manufactured semiconductor products, and on the other hand, the discharge event which does not affect the ion beam and is not to be detected is allowed not to be detected, and the classification is required to appropriately cope with the detected discharge event affecting the ion beam. Accordingly, the physical quantities characterizing the ion implantation process required in the ion implantation process can be implemented on the semiconductor wafer at given conditions without unnecessary deterioration in productivity of the semiconductor product.

The classification of FIGS. 3 and 4 is made by individually performing power supply voltage measurement of the plurality of power supplies installed on the beamline in the embodiment and comparing the setting values thereof and by accurately checking a degree of influence on the ion beam when the power supplies are discharged.

Next, an example of a method of detecting a discharge event affecting the ion beam in the ion implantation method according to the first embodiment will be described with reference to FIG. 5. FIG. 5 is a diagram illustrating a relation between detection of discharge event and discharge determination according to the first embodiment. As described with reference to FIGS. 3 and 4, in the first embodiment, the power supplies are classified into a power supply affecting the ion implantation dose, a power supply affecting the ion implantation angle, a power supply affecting the ion beam width in the wafer scanning direction, and a power supply affecting the ion beam width in the beam scanning direction before the ion implantation. Hereinafter, for the convenience of description, the description of the embodiments will be simplified with the power supply affecting the ion implantation dose and the power supply affecting the ion beam width in the beam scanning direction.

In one of the ion implantation methods according to the embodiment, the method of detecting a possibility of elementary discharge process using the beam current measurement by the dose cup 8 and the method of detecting a possibility of elementary discharge process using the power supply voltage measurement are used. Therefore, as illustrated in FIG. 5, it is understood that the reaction occurs in one of or a plurality of the methods of detecting a possibility of elementary discharge process among the method of detecting a possibility of elementary discharge process using the beam current measurement by the dose cup 8, the method of detecting a possibility of elementary discharge process according to a deviation of the measured value of the power supply voltage affecting the ion implantation dose from the setting value thereof, and the method of detecting a possibility of elementary discharge process according to a deviation of the measured value of the power supply voltage affecting the ion beam width in the beam scanning direction from the setting value thereof.

Particularly, Situation #1, and Situation #2 of FIG. 5 will be described more in detail. If simply described, the method of detecting a possibility of elementary discharge process using the measured value of the beam current measured by the dose cup 8 and the method of detecting a possibility of elementary discharge process using the power supply voltage measurement of the power supply affecting the ion implantation dose relate to the same ion implantation dose. Therefore, it is understood that the reaction does not occur in the case of using one of the methods of detecting a possibility of elementary discharge process like Situation #1 and Situation #2, but the reaction occurs in the case of necessarily using both of the methods of detecting a possibility of elementary discharge process like Situation #4. However, as described above, in the method of detecting a possibility of elementary discharge process using the measured value of the beam current measured by the dose cup 8, there is a measurement interval inversely proportional to the beam scan frequency by nature. Therefore, in the case where the beam scan frequency is low, the average time from the occurrence of discharge to the detection of discharge is too long, so that information on the discharge event affecting the ion beam may not be obtained practically. On the other hand, in the method of detecting a possibility of elementary discharge process using the power supply voltage measurement, since the measurement can be performed at a constant measurement interval, so that the measurement interval may be set to be shorter than a typical discharge duration of components on the beamline. Therefore, the information on the discharge event affecting the ion beam can be certainly obtained, and thus, the beam state in the ion implantation into the wafer can be determined. However, in the case where the beam scan frequency is high, the measurement interval is slightly longer than that of the discharge detection method using the measured value of the beam current measured by the dose cup 8, and if the time interval from the time of the reaction to the time of the countermeasures is considered to be included, there may a situation that the information on the discharge event affecting the ion beam can be obtained by only the method of detecting a possibility of elementary discharge process using the measured value of the beam current measured by the dose cup 8. Therefore, it is considered that Situations #1 and #2 of FIG. 5 are sufficient. With respect to Situations #5 and #6 of FIG. 5, the same description as the above-described description may be made.

FIG. 5 illustrates the case where, if discharge is detected by any one of the method of detecting a possibility of elementary discharge process using the beam current measurement and the above-described method of detecting a possibility of elementary discharge process using the power supply voltage detection, the event is determined as the discharge event affecting the ion beam. In other words, this method is a discharge detection method of considering all the cases where there is a possibility of the discharge event to be the discharge event in order to cope with a possible situation. Therefore, the beam is temporarily excluded from the beamline by temporarily applying a high voltage to the beam dump electrode 14 illustrated in FIGS. 1A and 1B, so that the ion beam is saved from the wafer to prevent the beam from being incident on the semiconductor wafer 10. After the discharge event ends, the beam returns to the beamline by removing the high voltage temporarily applied to the beam dump electrode 14, so that the beam is incident on the semiconductor wafer 10 again, and the ions are implanted again into the semiconductor wafer 10.

As an example of the ion implantation conditions and the ion implantation process specifically using the discharge determination method of FIG. 5, there is a case where the beam current measurement during the ion implantation into the wafer is performed and the allowable value of the uniformity of all the physical quantities characterizing the ion implantation process over the surface of the wafer is particularly tight. Anyway, in the discharge determination method of FIG. 5, if abnormality is detected by any one of the method of detecting a possibility of elementary discharge process using the beam current measurement using the dose cup 8 according to the embodiment and the method of detecting a possibility of elementary discharge process using a plurality of power supply voltage measurements, it is determined that there is an discharge event affecting the ion beam, and thus, it is determined that the beam state in the ion implantation into the wafer is abnormal. Therefore, the discharge determination method of FIG. 5 is selected in the case where the productivity of the semiconductor product can be improved in terms of as to whether or not the difference in performance of finally manufactured semiconductor products can be allowed not to exist or as to how many semiconductor products of which performance falls within an allowable range of the semiconductor product among the finally manufactured semiconductor products can be manufactured within a unit time.

Second Embodiment

Next, another example of the method of detecting the discharge event affecting the ion beam in the ion implantation method according to a second embodiment will be described with reference to FIG. 6. FIG. 6 is a diagram illustrating a relation between detection of discharge event and discharge determination according to the second embodiment. FIG. 6 illustrates the case where discharge is detected by the method of detecting a possibility of elementary discharge process using the beam current measurement and discharge is detected by the method of detecting a possibility of elementary discharge process using the power supply voltage measurement of a power supply belonging to one type among the plurality of power supplies which are classified into plurality types in advance. In the case of FIG. 6, if discharge is detected by the method of detecting a possibility of elementary discharge process according to a deviation of the measured value of the power supply voltage affecting the ion implantation dose from the setting value thereof, it is determined that there is a discharge event affecting the ion beam, and thus, it is determined that the beam state in the ion implantation into the wafer is abnormal.

As an example of the ion implantation conditions and the ion implantation process specifically using the discharge determination method of FIG. 6, there is a case where the beam current measurement during the ion implantation into the wafer is performed, the allowable value of the uniformity of the ion implantation dose over the surface of the wafer is relatively loose, and it is sufficient to make countermeasures only to the case where discharge of the components on the beamline occurs and the influence thereof is actually observed as the ion beam current amount. In addition, as described above, even in the case where a continuous change in beam current amount during the ion implantation occurs due to influence of the beam irradiation on the resist mask and the discharge event affecting the ion beam does not occur, if only the method of detecting a possibility of elementary discharge process using the beam current measurement using the dose cup 8 is used, the occurrence of the discharge event may be erroneously detected. Therefore, in this case, preferably, when the reaction occurs in both of the methods of detecting a possibility of elementary discharge process using the measured value of the beam current measured by the dose cup 8 and the method of detecting a possibility of elementary discharge process using the power supply voltage measurement of the power supply affecting the ion implantation dose, it is determined that the discharge event affecting the ion beam newly occurs.

Anyway, in the discharge determination method of FIG. 6, if discharge is detected by the method of detecting a possibility of elementary discharge process using the beam current measurement using the dose cup 8 and discharge is detected by the above-described method of detecting a possibility of elementary discharge process using the power supply voltage measurement of a power supply belonging to one type among the plurality of power supplies which are classified into plural types in advance, it is determined that there is a discharge event affecting the ion beam, and thus, it is determined that the beam state in the ion implantation into the wafer is abnormal (Situations #4 and #7). Therefore, the discharge determination method of FIG. 6 is selected in the case where the productivity of the semiconductor product can be improved in terms of as to whether or not the difference in performance of a finally manufactured semiconductor product can be allowed not to exist or as to how many semiconductor products of which performance falls within an allowable range of the semiconductor product among the finally manufactured semiconductor products can be manufactured within a unit time.

Each of the discharge determination methods of FIGS. 5 and 6 may be implemented by using the same discharge hardware in the same ion implanter. In other words, in the embodiment, the ion implantation method includes both of the method of detecting a possibility of elementary discharge process using the beam current measurement which can be performed at a measurement interval inversely proportional to the beam scan frequency and the method of detecting a possibility of elementary discharge process using the power supply voltage measurement which can be performed at a certain measurement interval, and the above-described discharge event affecting the ion beam is detected by using the information obtained from the two types of the methods of detecting a possibility of elementary discharge process. In the ion implantation method, the ion implantation conditions are set before the ion implantation in advance, and it is determined by using plural types of the discharge detection methods according to the ion implantation conditions whether or not the beam state in the ion implantation into the wafer is abnormal.

Third Embodiment

Next, another example of a method of detecting a discharge event affecting the ion beam or a discharge event affecting the ion implantation conditions in an ion implantation method according to a third embodiment will be described with reference to FIG. 7. FIG. 7 is a diagram illustrating a relation between detection of discharge event and discharge determination according to the third embodiment. FIG. 7 illustrates the case where, irrespective of the discharge detection by the method of detecting a possibility of elementary discharge process using the beam current measurement, if discharge is detected by the method of detecting a possibility of elementary discharge process using the power supply voltage measurement, it is determined that there is a discharge event affecting the ion beam, and thus, it is determined that the beam state in the ion implantation into the wafer is abnormal.

As an example of the ion implantation conditions and the ion implantation process specifically using the discharge determination method of FIG. 7, there is a case where the beam current measurement during the ion implantation into the wafer is performed and the allowable value of the uniformity of all the physical quantities characterizing the ion implantation process over the surface of the wafer is particularly tight and the ion beam scan frequency is low. Hereinafter, this case will be described in detail.

As described above, in an ion implantation process where the difference in performance of finally manufactured semiconductor products with respect to the difference in ion implantation dose is large, in the case where a continuous change in beam current amount during the ion implantation occurs due to influence of the beam irradiation on the resist mask, sometimes, the beam current measurement using the dose cup 8 needs to be performed, and the speed of mechanical scanning of the wafer needs to be controlled. Although the time constant is long and the ion beam scan frequency is low, the influence of the beam irradiation on the resist mask has no problem in terms of the control of the speed of mechanical scanning of the wafer. However, as described above, in the case where the ion beam scan frequency is low, the average time from the occurrence of discharge to the detection of discharge is too long in terms of the use of the beam current measurement using the dose cup 8 to the discharge detection, information on the discharge event affecting the ion beam, that is, information on the beam state in the ion implantation into the wafer cannot be obtained practically during the ion implantation into the wafer. In this case, it is preferable that the beam current measurement using the dose cup 8 is used to control only the speed of mechanical scanning of the wafer but it is not used for the discharge detection.

Therefore, in the case where the beam current measurement during the ion implantation into the wafer is performed, and the allowable value of the uniformity of all the physical quantities characterizing the ion implantation process over the surface of the wafer is particularly tight and the ion beam scan frequency is low, irrespective of the discharge detection by the method of detecting a possibility of elementary discharge process using the beam current measurement, if discharge is detected by the method of detecting a possibility of elementary discharge process using the power supply voltage measurement, it is appropriate to determine that there is a discharge event affecting the ion beam, and thus, to determine that the beam state in the ion implantation into the wafer is abnormal. Anyway, in the discharge determination method of FIG. 7, among the method of detecting a possibility of elementary discharge process using the beam current measurement using the dose cup 8 and the method of detecting a possibility of elementary discharge process using a plurality of power supply voltage measurements, irrespective of the discharge detection by the method of detecting a possibility of elementary discharge process using the beam current measurement, if discharge is detected by the method of detecting a possibility of elementary discharge process using the power supply voltage measurement, it is determined that there is a discharge event affecting the ion beam, and thus, it is determined that the beam state in the ion implantation into the wafer is abnormal (Situations #2 to #7). Therefore, the discharge determination method of FIG. 7 is selected in the case where the productivity of the semiconductor product can be improved in terms of as to whether or not the difference in performance of finally manufactured semiconductor products can be allowed not to exist or as to how many semiconductor products of which performance falls in an allowable range of the semiconductor product among the finally manufactured semiconductor products can be manufactured within a unit time.

Fourth Embodiment

Next, another example of a method of detecting a discharge event affecting the ion beam in an ion implantation method according to a fourth embodiment will be described with reference to FIGS. 8 and 9. FIG. 8 is a diagram illustrating a relation between detection of discharge event and discharge determination according to the fourth embodiment. FIG. 9 is a diagram illustrating a relation between detection of discharge event and discharge determination according to the fourth embodiment. FIGS. 8 and 9 illustrate the cases where, irrespective of the discharge detection by the method of detecting a possibility of elementary discharge process using the beam current measurement, if discharge is detected by the method of detecting a possibility of elementary discharge process using the power supply voltage measurement of a power supply belonging to one type among the plurality of power supplies which are classified into plural types in advance, it is determined that there is a discharge event affecting the ion beam, and thus, it is determined that the beam state in the ion implantation into the wafer is abnormal.

FIG. 8 illustrates the case where, irrespective of the discharge detection by the method of detecting a possibility of elementary discharge process using the beam current measurement, if discharge is detected by the method of detecting a possibility of elementary discharge process according to a deviation of the measured value of the power supply voltage affecting the ion implantation dose from the setting value thereof among the plurality of power supplies which are classified into plural types in advance, it is determined that there is a discharge event affecting the ion beam, and thus, it is determined that the beam state in the ion implantation into the wafer is abnormal.

As an example of the ion implantation conditions and the ion implantation process specifically using the discharge determination method of FIG. 8, there is a case where the beam current measurement during the ion implantation into the wafer is performed and the allowable value of the uniformity of the ion implantation dose over the surface of the wafer is particularly tight and the beam scan frequency is low.

Next, FIG. 9 illustrates the case where, irrespective of the discharge detection by the method of detecting a possibility of elementary discharge process using the beam current measurement, if discharge is detected by the method of detecting a possibility of elementary discharge process according to a deviation of the measured value of the power supply voltage affecting an ion beam width in the beam scanning direction from the setting value thereof among the plurality of power supplies which are classified into plural types in advance, it is determined that there is a discharge event affecting the ion beam, and thus, it is determined that the beam state in the ion implantation into the wafer is abnormal.

The discharge determination method of FIG. 9 is selected in the case where the productivity of the semiconductor product can be improved in terms of as to whether or not to the difference in performance of finally manufactured semiconductor products can be allowed not to exist by controlling the value of the ion beam width in the beam scanning direction in an ion implantation process of a semiconductor manufacturing process or as to how may semiconductor products of which performance falls within an allowable range of the semiconductor product among the finally manufactured semiconductor products can be manufactured within a unit time.

Particularly, as illustrated in FIG. 9, in the case where the value of the ion beam width in the beam scanning direction is changed due to the discharge event affecting the ion beam, the discharge event cannot be accurately detected by using the method of detecting a possibility of elementary discharge process using the beam current measurement using the dose cup 8. Namely, in the example of FIG. 9, in the case where the difference in performance of finally manufactured semiconductor products can be allowed not to be exist by controlling the value of the ion beam width in the beam scanning direction, Situation #3, Situation #5, Situation #6, and Situation #7 are to be detected as the discharge event affecting the ion beam. However, if the discharge detection using the beam current measurement using the dose cup 8 is used, Situation #5 and Situation #7 can be detected, but Situation #3 and Situation #6 cannot be detected and Situation #1 and Situation #4 are erroneously detected. Therefore, in the ion implantation process where the difference in performance of finally manufactured semiconductor products with respect to the difference in the ion beam width in the beam scanning direction is large, the productivity of the semiconductor product is deteriorated due to the erroneous detection of the discharge event affecting the ion beam, and a portion of the discharge event affecting the ion beam is missed, so that there is a difference in performance of finally manufactured semiconductor products over the surface of the wafer.

The situations of the ion implantation angle, an ion beam width in the wafer scanning direction, and the ion beam width in the beam scanning direction among physical quantities characterizing the ion implantation process required in the ion implantation process are the same as the above-described situation. Namely, in the embodiment, in the ion implantation process where the difference in performance of finally manufactured semiconductor products with respect to the difference in one of or a plurality of physical quantities among the ion implantation angle, the ion beam width in the wafer scanning direction, and the ion beam width in the beam scanning direction is large, the deterioration in productivity of the semiconductor product due to the erroneous detection of the discharge event affecting the ion beam can be prevented, and the difference in performance of finally manufactured semiconductor products over the surface of the wafer due to overlooking the discharge event affecting the ion beam can be prevented.

Fifth Embodiment

Next, still another example of a method of detecting a discharge event affecting the ion beam in an ion implantation method according to a fifth embodiment will be described with reference to FIG. 10. FIG. 10 is a diagram illustrating a relation between detection of discharge event and discharge determination according to the fifth embodiment. FIG. 10 illustrates the case where the settings of the ion implantation method of performing no beam current measurement during the ion implantation into the semiconductor wafer 10 is employed and if discharge is detected by the method of detecting a possibility of elementary discharge process according to a deviation of the measured value of the power supply voltage affecting the ion beam width in the beam scanning direction from the setting value thereof among the plurality of power supplies which are classified into plural types in advance, it is determined that there is a discharge event affecting the ion beam, and thus, it is determined that the beam state in the ion implantation into the wafer is abnormal.

In an ion implantation process of a semiconductor manufacturing process, in the case where the difference in performance of finally manufactured semiconductor products can be allowed not to exist by controlling the value of the ion beam width in the beam scanning direction, the beam current measurement using the dose cup 8 is unnecessary in terms of the discharge detection. Therefore, for example, in the case where the difference in ion implantation dose does not particularly influence the performance of finally manufactured semiconductor products, the beam current measurement itself during the ion implantation is unnecessary. Accordingly, for example, the method of FIG. 10 may be appropriate.

Hereinafter, several aspects of the present invention will be described.

An ion implantation method according to an aspect of the embodiment is an ion implantation method of transporting ions generated by the ion source 1 to the semiconductor wafer 10 to implant the ions into the semiconductor wafer 10 by irradiating an ion beam, wherein the process of implanting the ions into the wafer includes a state determination process of determining a state of the ion beam based on the existence of an event having a possibility of discharge detected by a plurality of detection units (for example, the dose cups 8 or power supply voltage measurement units 21 to 27) which can detect the event having a possibility of discharge and a degree of influence of the event on the ion beam. Accordingly, discharge is appropriately detected, and the state of the ion beam can be determined at good accuracy. Herein, the event having a possibility of discharge may include the above-described discharge event or the like.

The ion implantation method may further include an ion implantation process of implanting the ions into the wafer while scanning the ion beam. In the state determination process, the event having a possibility of discharge may be detected by using a beam current measurement unit (the dose cup 8) which can measure the ion beam current in each ion beam scanning as one of the plurality of detection units. Accordingly, a discharge event can be appropriately detected. In addition, the ion implantation process may be performed by reciprocally scanning the ion beam in one direction and mechanically scanning the wafer in the direction perpendicular to the beam scanning direction.

In the state determination process, the event having a possibility of discharge may be detected by using a power supply voltage measurement unit (for example, the power supply voltage measurement unit 21) which measures power supply voltages of the components on the beamline from the ion sources to the wafer as one of the plurality of detection units. Accordingly, discharge can be directly detected.

In the state determination process, the event having a possibility of discharge may be detected by using a plurality of power supply voltage measurement units (for example, the power supply voltage measurement units 21 to 27), each of which measures power supply voltages of the components on the beamline from the ion sources to the wafer as a portion of the plurality of detection units. Accordingly, discharge can be directly detected at good accuracy.

In the state determination process, in the case where at least one of the plurality of detection units detects the event having a possibility of discharge, it may be determined that the state of the ion beam is abnormal. Accordingly, the situations that the event actually having a possibility of discharge cannot be detected can be reduced.

In the state determination process, in the case where the beam current measurement unit detects the event having a possibility of discharge and the at least one of the power supply voltage measurement units detects the event having a possibility of discharge, it may be determined that the state of the ion beam is abnormal. Accordingly, discharge can be detected at good accuracy.

In the state determination process, in the case where the beam current measurement unit detects the event having a possibility of discharge and the power supply voltage measurement unit belonging to one group including the plurality of power supply voltage measurement units which are classified into plural groups according to influence thereof on the ion beam detects the event having a possibility of discharge, it may be determined that the state of the ion beam is abnormal. Accordingly, discharge can be detected at good accuracy.

In the state determination process, a combination of the plurality of detection units used to detect the event having a possibility of discharge may be determined according to various settings of the ion implantation conditions. Accordingly, the event having a possibility of discharge can be detected by using the plurality of detection units appropriate for the ion implantation conditions.

In addition, another aspect of the present invention is the ion implanter 100. The ion implanter 100 is configured to include components on the beamline (the ion source 1, the extraction electrode 2, the beam scanner 5, the parallel lens 6, the electrostatic lens 12, the beam dump electrode 14, and the like) which transports ions generated by the ion source 1 to a semiconductor wafer 10, a plurality of detection units (the dose cups 8 or power supply voltage measurement units 21 to 27) which can detect an event having a possibility of discharge in an ion implantation process by irradiating an ion beam on the semiconductor wafer 10, and a determination unit 30 (refer to FIG. 1B) which determines a state of the ion beam based on the existence of the event having a possibility of discharge detected by the plurality of detection units and a degree of influence of the event on the ion beam. Accordingly, discharge can be appropriately detected, and the state of the ion beam can be determined at good accuracy.

The components may further include the beam scanner 5 which scans the ion beam. One of the plurality of detection units may be the beam current measurement unit (the dose cup 8) which can measure the ion beam current for each ion beam scanning, and a portion of the plurality of detection units may be the plurality of power supply voltage measurement units 21 to 27 which measure the power supply voltages of the power supplies of each component on the beamline from the ion source to the wafer. Accordingly, a discharge event can be appropriately detected.

In the case where at least one of the plurality of detection units detects the event having a possibility of discharge, the determination unit 30 may determine that the state of the ion beam is abnormal. Accordingly, the situations that the event actually having a possibility of discharge cannot be detected can be reduced.

In the case where the beam current measurement unit detects the event having a possibility of discharge and the power supply voltage measurement unit belonging to one group including the plurality of power supply voltage measurement units which are classified into plural groups according to influence thereof on the ion beam detects the event having a possibility of discharge, the determination unit 30 may determine that the state of the ion beam is abnormal. Accordingly, discharge can be detected at good accuracy.

Hereinbefore, although the present invention is described with reference to the exemplary embodiments, the present invention is not limited to the embodiments, but appropriate combination or replacement of the components of the embodiments are included in the present invention. In addition, it will be understood by those skilled in the art that a combination of the embodiments, a rearrangement of a sequence of processes and an addition of a change such as various design modifications to the embodiments can be available, and embodiments added with the changes are also included in the scope of the present invention.

Priority is claimed to Japanese Patent Application No. 2012-192420, filed Aug. 31, 2012, the entire content of which is incorporated herein by reference.

What is claimed is:

1. An ion implantation method of transporting ions generated by an ion source to a wafer and implanting the ions into the wafer by irradiating an ion beam on the wafer, the method comprising
during the ion implantation into the wafer, using a plurality of detection units which can detect an event having a possibility of discharge and determining a state of the ion beam based on existence of detected event having a possibility of discharge and a degree of influence of the event on the ion beam.

2. The ion implantation method according to claim 1, further comprising implanting the ions into the wafer by the ion beam scanning, wherein
in the determining the state of the ion beam, the event having a possibility of discharge is detected by using a beam current measurement unit as one of the plurality of detection units, which measures a current of the ion beam in each ion beam scanning.

3. The ion implantation method according to claim 2, wherein
in the implanting the ions, the ion beam reciprocally scans in one direction, and the wafer is mechanically scanned in a direction perpendicular to the beam scanning direction.

4. The ion implantation method according to claim 2, wherein
in the determining the state of the ion beam, the event having a possibility of discharge is detected by using a power supply voltage measurement unit as one of the plurality of detection units, which measures a voltage of a power supply of a component constituting a beamline from the ion source to the wafer.

5. The ion implantation method according to claim 2, wherein
in the determining the state of the ion beam, the event having a possibility of discharge is detected by using a plurality of power supply voltage measurement units as a portion of the plurality of detection units, which measures voltages of power supplies of each component constituting a beamline from the ion source to the wafer.

6. The ion implantation method according to claim 1, wherein
in the determining the state of the ion beam, in the case where at least one of the plurality of detection units detects the event having a possibility of discharge, it is determined that the state of the ion beam is abnormal.

7. The ion implantation method according to claim 4, wherein
in the determining the state of the ion beam, in the case where the beam current measurement unit detects the event having a possibility of discharge and at least one of the power supply voltage measurement units detects the event having a possibility of discharge, it is determined that the state of the ion beam is abnormal.

8. The ion implantation method according to claim 5, wherein
in the determining the state of the ion beam, in the case where the beam current measurement unit detects the event having a possibility of discharge and the power supply voltage measurement unit belonging to one group among the plurality of power supply voltage measurement units which are classified into plural groups according to influence thereof on the ion beam detects the event having a possibility of discharge, it is determined that the state of the ion beam is abnormal.

9. The ion implantation method according to claim 1, wherein
in the determining the state of the ion beam, a combination of the plurality of detection units used to detect the event having a possibility of discharge is determined according to various settings defining ion implantation conditions.

10. An ion implantation apparatus comprising:
a component constituting a beamline which transports ions generated by an ion source to a wafer;
a plurality of detection units which can detect an event having a possibility of discharge during ion implantation into the wafer by irradiating an ion beam on the wafer; and a determination unit which determines a state of the ion beam based on existence of the event having a possibility of discharge detected by at least one of the plurality of detection units and a degree of influence of the event on the ion beam.

11. The ion implantation apparatus according to claim 10, wherein the component includes a beam scanner which scans with the ion beam,
wherein at least one of the plurality of detection units is a beam current measurement unit which can measure a current of the ion beam in each ion beam scanning, and
wherein a portion of the plurality of detection units include a plurality of power supply voltage measurement units which measure voltages of power supplies of each component constituting the beamline from the ion source to the wafer.

12. The ion implantation apparatus according to claim 10, wherein
in the case where at least one of the plurality of detection units detects the event having a possibility of discharge, the determination unit determines that the state of the ion beam is abnormal.

13. The ion implantation apparatus according to claim 11, wherein
in the case where the beam current measurement unit detects the event having a possibility of discharge and the power supply voltage measurement unit belonging to one group among the plurality of power supply voltage measurement units which are classified into plural groups according to influence thereof on the ion beam detects the event having a possibility of discharge, the determination unit determines that the state of the ion beam is abnormal.

14. A method of ion implantation using the ion implantation apparatus according to claim 10, the method comprising:
using the component constituting the beamline to transport the ions generated by the ion source to the wafer and implanting the ions into the wafer by irradiating the ion beam on the wafer, and
during the ion implantation into the wafer, using the plurality of detection units to detect an event having a possibility of discharge and using the determination unit to determine a state of the ion beam based on existence of the detected event and a degree of influence of the event on the ion beam.

15. The method according to claim 14, further comprising implanting the ions into the wafer by scanning the ion beam, wherein
in the determining the state of the ion beam, the event having a possibility of discharge is detected by using a beam current measurement unit as one of the plurality of detection units, which measures a current of the ion beam in each ion beam scanning.

16. The method according to claim 15,
further comprising, in the implanting of the ions, reciprocally scanning the ion beam in one direction, and mechanically scanning the wafer in a direction perpendicular to the beam scanning direction.

17. The method according to claim 15, wherein
in the determining the state of the ion beam, the event having a possibility of discharge is detected by using a power supply voltage measurement unit as one of the plurality of detection units, which measures a voltage of a power supply of a component constituting a beamline from the ion source to the wafer.

18. The method according to claim 15, wherein
in the determining the state of the ion beam, the event having a possibility of discharge is detected by using a plurality of power supply voltage measurement units as a portion of the plurality of detection units, which measures voltages of power supplies of each component constituting a beamline from the ion source to the wafer.

19. The method according to claim 14, wherein
the determining the state of the ion beam includes determining that the state of the ion beam is abnormal in response to at least one of the plurality of detection units detecting the event having a possibility of discharge.

20. The method according to claim 14, further comprising:
determining which ones of the plurality of detection units will be used to detect the event having a possibility of discharge based on settings defining ion implantation conditions.

* * * * *